United States Patent
St. Amour et al.

(10) Patent No.: US 10,553,430 B2
(45) Date of Patent: Feb. 4, 2020

(54) TECHNOLOGIES FOR INVERTING LITHOGRAPHIC PATTERNS AND SEMICONDUCTOR DEVICES INCLUDING HIGH ASPECT RATIO STRUCTURES

(71) Applicant: INTEL CORPORATION, Santa Clara, CA (US)

(72) Inventors: Anthony A. St. Amour, Portland, OR (US); Christopher P. Auth, Portland, OR (US)

(73) Assignee: INTEL CORPORATION, Santa Clara, CA (US)

( * ) Notice: Subject to any disclaimer, the term of this patent is extended or adjusted under 35 U.S.C. 154(b) by 0 days.

(21) Appl. No.: 15/755,466

(22) PCT Filed: Sep. 25, 2015

(86) PCT No.: PCT/US2015/052321
§ 371 (c)(1),
(2) Date: Feb. 26, 2018

(87) PCT Pub. No.: WO2017/052614
PCT Pub. Date: Mar. 30, 2017

(65) Prior Publication Data
US 2018/0247813 A1    Aug. 30, 2018

(51) Int. Cl.
*H01L 21/033* (2006.01)
*H01L 21/306* (2006.01)
*H01L 21/308* (2006.01)
*H01L 21/768* (2006.01)
*H01L 23/522* (2006.01)
*H01L 29/78* (2006.01)

(52) U.S. Cl.
CPC ...... *H01L 21/0337* (2013.01); *H01L 21/3081* (2013.01); *H01L 21/30608* (2013.01); *H01L 21/76885* (2013.01); *H01L 21/76897* (2013.01); *H01L 23/5226* (2013.01); *H01L 29/785* (2013.01)

(58) Field of Classification Search
None
See application file for complete search history.

(56) References Cited

U.S. PATENT DOCUMENTS

| | | | |
|---|---|---|---|
| 9,005,548 | B2 | 4/2015 | Henry et al. |
| 2008/0038660 | A1 | 2/2008 | Doneda et al. |
| 2012/0181705 | A1 | 7/2012 | Tang et al. |
| 2015/0200106 | A1 | 7/2015 | Guha et al. |

FOREIGN PATENT DOCUMENTS

| | | |
|---|---|---|
| DE | 112015006940 T5 | 6/2018 |
| JP | 2008-053734 A | 3/2008 |
| TW | 201729279 A | 8/2017 |
| WO | 2017-052614 A1 | 3/2017 |

OTHER PUBLICATIONS

International Search Report and Written Opinion issued in PCT Application No. PCT/US2015/052321, dated Jun. 27, 2016, 7 pages.
International Preliminary Report on Patentability and Written Opinion issued in PCT Application No. PCT/US2015/052321, dated Apr. 5, 2018, 6 pages.

*Primary Examiner* — Long Pham
(74) *Attorney, Agent, or Firm* — Grossman, Tucker, Perreault & Pfleger, PLLC (57) ABSTRACT

Technologies for inverting lithographic patterns are described. In some embodiments the technologies include a method for inverting a lithographic pattern of hole precursors, so as to form one or more high aspect ratio structures on or in a surface of a substrate.

14 Claims, 7 Drawing Sheets

TECHNOLOGIES FOR INVERTING LITHOGRAPHIC PATTERNS AND SEMICONDUCTOR DEVICES INCLUDING HIGH ASPECT RATIO STRUCTURES

CROSS-REFERENCE TO RELATED APPLICATIONS

This present application is a National Phase Application Filed Under 35 U.S.C. 371 claiming priority to PCT/US2015/052321 filed Sep. 25, 2015, the entire disclosure of which is incorporated herein by reference.

FIELD

The present disclosure relates to technologies for inverting lithographic patterns. In particular, embodiments of the present disclosure relate to technologies for inverting lithographic patterns to facilitate the production of various structures during the manufacturing of a semiconductor device.

BACKGROUND

The production of semiconductor devices often involves forming microelectronic devices on a microelectronic substrate, such as a silicon wafer. Such microelectronic devices may include for example transistors, resistors, capacitors, combinations thereof, and the like, which may be connected to one another and other components via a metallization pattern (e.g., metal interconnects), so as to form one or more integrated circuits.

Various processes are known for forming integrated circuits on a microelectronic substrate. Among those processes is the so-called "damascene process," which typically involves using a photoresist and etching processes to selectively remove material from the microelectronic substrate or other dielectric material. For example, the photoresist may be patterned on a dielectric material, after which the dielectric material may be etched to form a hole or "trench" (hereinafter, opening) consistent with the photoresist pattern. After etching, the photoresist may be removed (e.g., using an oxygen plasma or selective wet/dry etching) and the opening may be filled with a conductive material such as a metal or metal alloy, e.g., via physical vapor deposition, chemical vapor deposition, electroplating, or some other mechanism as will be understood to those skilled in the art.

Over time the size of microelectronic devices has shrunk dramatically, while the complexity of such devices has increased. As a result it is becoming increasingly difficult to form various features (e.g., vias, via plugs, traces, etc.) using existing photolithographic techniques, such as those that may be used in a Damascene process. Indeed in many cases semiconductor manufacturing engineers are now tasked with forming features on one or more layers of a semiconductor device/substrate, wherein such features have at least one dimension that is smaller than the wavelength of light used in an available photolithographic tool.

For example many photolithographic tools employ a laser (e.g., an excimer laser) to project an image of a feature to be formed on a substrate with deep ultraviolet (UV) light at a wavelength of about 248 nanometers (nm) or about 193 nm. Although useful, the feature size that may be reliably formed by such tools may be limited. For example, excimer UV photolithography may be used to produce features having a minimum features size of about 50 nm. While it is possible to use such tools to produce features with a minimum feature size less than 50 nm, doing so may be practically difficult for a variety of reasons. Moreover as features with ever smaller minimum feature size are becoming increasingly desirable, it may be increasingly important to form such features within increasingly tight tolerances. This may further exacerbate challenges associated with using some photolithographic tools to produce smaller and smaller features. Indeed even if certain tools may be used to produce features with a minimum feature size below 50 nm, such features may exhibit unacceptably high variance and therefore may be unable to meet one or more desired tolerances.

BRIEF DESCRIPTION OF THE DRAWINGS

Features and advantages of embodiments of the claimed subject matter will become apparent as the following Detailed Description proceeds, and upon reference to the Drawings, wherein like numerals depict like parts, and in which:

Although the following Detailed Description will proceed with reference being made to illustrative embodiments, many alternatives, modifications, and variations thereof will be apparent to those skilled in the art.

DETAILED DESCRIPTION

As noted in the background, photolithographic techniques are often employed to form various structures during the production of a semiconductor device. As the minimum feature size of such structures decreases, however, it may become increasingly difficult to manufacture such structures, generally and/or within acceptable tolerance thresholds.

For example during the production of features included in many semiconductor devices, it may be desirable to form high aspect ratio structures that extend from a surface of a substrate. As used herein, the term "high aspect ratio structure" refers to a structure that is relatively large in a first dimension, but which is relatively small in a second dimension. One non-limiting example of a high aspect ratio structure is a pillar extending from the surface of a substrate. In some embodiments, such pillars may exhibit a height:width ratio ranging from greater than 1:1 to about 10:1, or even from greater than 1:1 to about 100:1. Of course such height:width ratios are identified for the sake of example only, and high aspect ratio devices with other height:width ratio may be employed.

As may be appreciated by those of skill in the art, high aspect ratio structures such as pillars may be useful in a variety of applications. For example, such features may be used as via plugs in one or more interconnect layers of a semiconductor device. In such an application, high aspect ratio structures such as pillars may function to isolate metal lines (or other conductive structures) from one another, e.g., to prevent electrical shorting. Of course, other uses for high aspect ratio structures in semiconductor devices are known and are contemplated by the present disclosure.

Existing photolithographic techniques are capable of forming high aspect ratio structures that have a relatively large minimum feature size (e.g., a width greater than or equal to about 50 nm) with an acceptable degree of quality, and within desired tolerances. As semiconductor devices continue to shrink, however, it may be desirable to form high aspect ratio structures having a minimum feature size (e.g., width) that is less than about 50 nm, such as between about 2 to less than about 50 nm, about 5 nm to about 40 nm, or even about 10 nm to about 25 nm. As before, such high aspect ratio structures may be suitable for use as via plugs in an interconnect layer, and/or in various other applications.

As noted in the background it may be practically difficult to use many lithographic techniques to produce relatively small structures that meet acceptable tolerances for a variety of reasons. For example, some existing lithographic methods of forming high aspect ratio structures involve processing a workpiece including a layer of photoresist on the surface of a substrate. Such processing may involve, for example, curing portions of the layer of photoresist (e.g. via the application of light and/or heat) to form cured regions defining locations at which high aspect ratio structures are to be formed in the substrate. The uncured portions of the photoresist may then be removed to expose the underlying surface of the substrate. Following such removal, a wet or dry etching process may be used to etch the exposed regions of the substrate, while leaving portions of the substrate protected by the cured photoresist substantially unaffected. The result of such etching may be the production of one or more high aspect ratio structures (e.g., a pillar) under the regions of cured photoresist.

Although highly useful for many applications, such methods may be unable to reliably produce high aspect ratio features that have a minimum feature size (e.g., width) below about 50 nm, and which meet desired tolerances. Without wishing to be bound by theory, it is believed that unacceptable feature variation may result from the use of relatively small regions of cured photoresist to define locations at which high aspect ratio features are to be formed. This may be particularly true in instances where the photoresist must be applied at a certain minimum thickness. In such instances when the minimum feature size (e.g., width) of the high aspect ratio structure decreases, use of the above methods will involve the production of relatively tall but relatively thin (i.e., high aspect ratio) regions of cured photoresist on one or more layers that are to be etched. Such high aspect ratio regions of cured photoresist may be mechanically unstable and may be susceptible to puddling, collapsing, or other mechanical deformation. As may be appreciated, any of such issues may introduce an undesirable amount of variability when high aspect ratio structures are subsequently formed in the underlying substrate, e.g., via etching.

With the foregoing in mind, the present disclosure generally relates to technologies for inverting lithographic patterns. As will be appreciated, the technologies described herein may be particularly useful for producing high aspect ratio structures having relatively small minimum feature size, e.g., a width ranging from about 2 nm to less than about 50 nm. Such structures may be particularly useful, for example, as via plugs that may be used to isolate conductors from one another in an interconnect layer of a semiconductor device. However, it should be understood that such end uses are for the sake of example only, and that the methods described herein may be useful in any instance where it may be desired to produce a high aspect ratio structure using a lithographic process.

Figure 1:
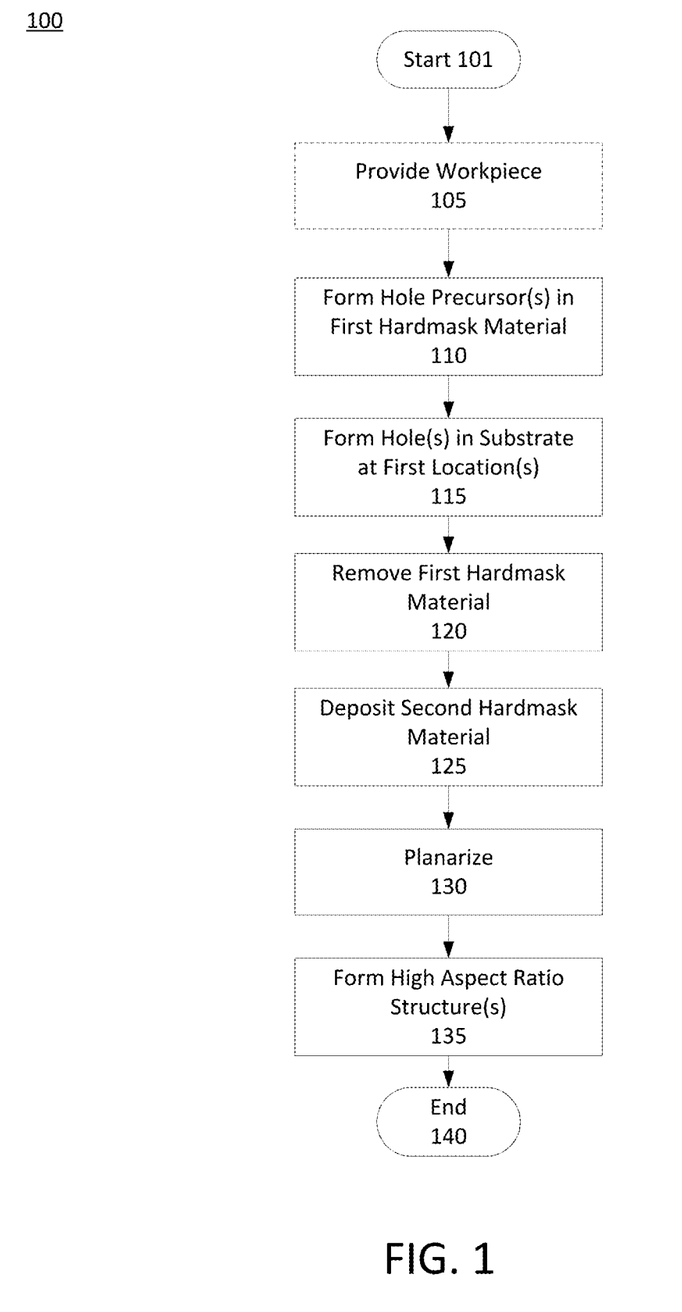
FIG. 1 is a flow diagram of example operations of a method of inverting a lithographic pattern consistent with the present disclosure.

Reference is therefore made to FIG. 1, which is a flow chart of example operations of a method of inverting lithographic patterns consistent with the present disclosure. For the sake of clarity and ease of understanding various operations of the method of FIG. 1 will be described in conjunction with FIGS. 2A-2G, which stepwise illustrate the formation of high aspect ratio structures consistent with the present disclosure. It should be understood that the illustrations of FIGS. 2A-2G are not to scale, and that the geometry of the illustrated features in such FIGS. is for the sake of example only.

As shown in FIG. 1, method 100 may begin at block 100. The method may then proceed to optional block 105, pursuant to which a workpiece may be provided. In this context, the provision of a workpiece may be understood to involve the production of a workpiece consistent with the present disclosure, as will be described later. Of course in instances where a suitable workpiece is previously generated (e.g., by a third party), separate provisioning of the workpiece is not required. Hence, block 105 is illustrated with hashing to demonstrate its optional nature.

As used herein, the term "workpiece" refers to any of a wide variety of substrates, electronic components, microelectronic components, combinations thereof, and the like, which may be used during the production of one or more semiconductor devices. In some embodiments, the workpiece described herein may be a precursor to one or more components of a semiconductor device, such as but not limited to an interconnect layer or a portion of an interconnect layer. In such instances, the high aspect ratio structures described herein may be used as via plugs in an interconnect structure, or for another purpose. Alternatively or additionally, the workpiece described herein may be a precursor used in the formation of one or more semiconductor devices, such as one or more transistors. For example the workpiece described herein may be used in the production of one or more non-planar transistors, such as but not limited to a non-planar fin based field effect transistor (FINFET). In such instances it may be appreciated that the high aspect ratio structures described herein may be useful, for example, as one or more fins of such a transistor. Without limitation, the workpieces of the present disclosure are preferably a microelectronic component/device or a precursor thereof.

Figure 2A:
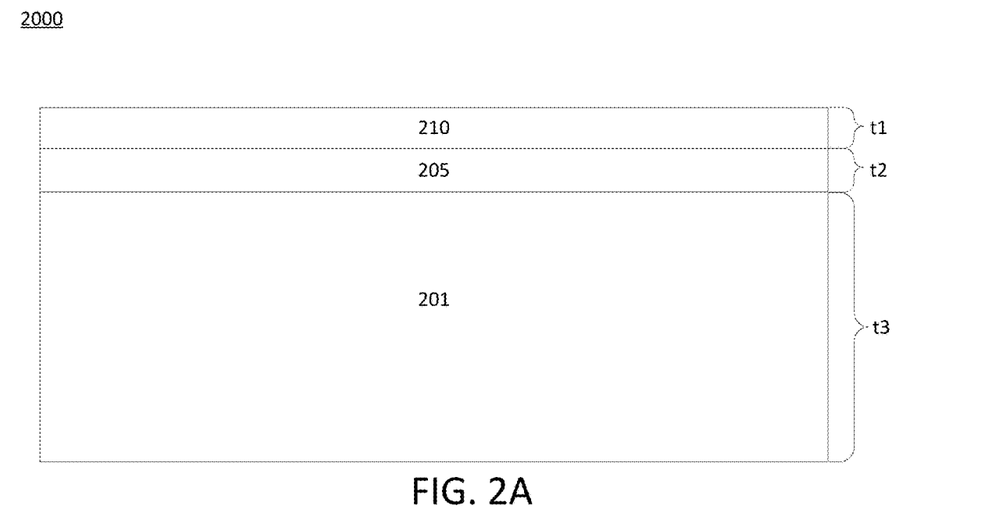
FIGS. 2A-2G stepwise illustrate the inversion of a photolithographic pattern to form one or more pillars on a substrate consistent with the method of FIG. 1.

As one example of the structure of a suitable workpiece that may be used, reference is made to FIG. 2A, which depicts the structure of one example workpiece 2000. As shown, workpiece 2000 includes a substrate 201. A layer of etch stop 205 may be disposed on substrate 201, and a layer of first hard mask material 210 may be disposed on the layer of etch stop 205.

In general, workpiece 2000 may be configured such that substrate 201, the layer of etch stop 205, and the layer of first hard mask material 210 may be etched by the same or different wet or dry etching chemistry. For example and as will be described in detail below, workpiece 2000 may be configured such that a first etching chemistry may selectively etch first hard mask material 210, without or without substantially etching etch stop 205 and/or substrate 201. Workpiece 2000 may also be configured such that a second etch chemistry may be used to selectively etch the layer of etch stop 205, without or without substantially etching first hard mask material 210. Moreover, workpiece 2000 may be configured such that substrate 201 may be etched by the same or a different etching chemistry as the second etching chemistry.

That is, in some embodiments the second etching chemistry may etch both the layer of etch stop 205 and substrate 201. Alternatively in other embodiments, the second etching chemistry may selectively etch only the layer of etch stop 205. In such instances, workpiece 2000 may be configured such that a third etching chemistry may be used to selectively etch substrate 201, without or without substantially etching first hard mask material 210 and/or etch stop 205.

As used herein, the phrase "does not etch or does not substantially etch" and similar phrases (e.g., indicating that a material is unaffected or substantially unaffected) mean that an etching chemistry either does not etch a specified material (or layer thereof), or etches that material at a substantially slower (e.g., about 10 to about 100 times slower) rate than the chemistry etches another specified material (or layer thereof).

With the foregoing in mind, substrate 201 may be formed from or include any suitable material. In some embodiments for example substrate 201 may be formed from or include one or more materials that are suitable for use in semiconductor applications. Non-limiting examples of such materials include semiconductor materials such as silicon, polysilicon, III-V semiconductors, IV-VI semiconductors, combinations thereof, and the like; carbides such as silicon carbide, tungsten carbide, etc., combinations thereof, and the like; oxides such as silicon oxides (e.g., $SiO_x$ such as $SiO_2$), carbon doped oxide (CDO), hafnium oxide, hafnium silicon oxide, lanthanum oxide, lanthanum aluminum oxide, zirconium oxide, zirconium silicon oxide, tantalum oxide, yttrium oxide, aluminum oxide, lead scandium tantalum oxide, lead zinc niobate, and combinations thereof and the like; and nitrides such as silicon nitride, titanium nitride, combinations thereof, and the like). Without limitation, in some embodiments substrate 201 is formed from or includes one or more oxides. In such instances, the oxide of substrate 201 may be selected such that may be etched by the same or different etching chemistry as may be used to etch the layer of etch stop 205.

Figure 2B:
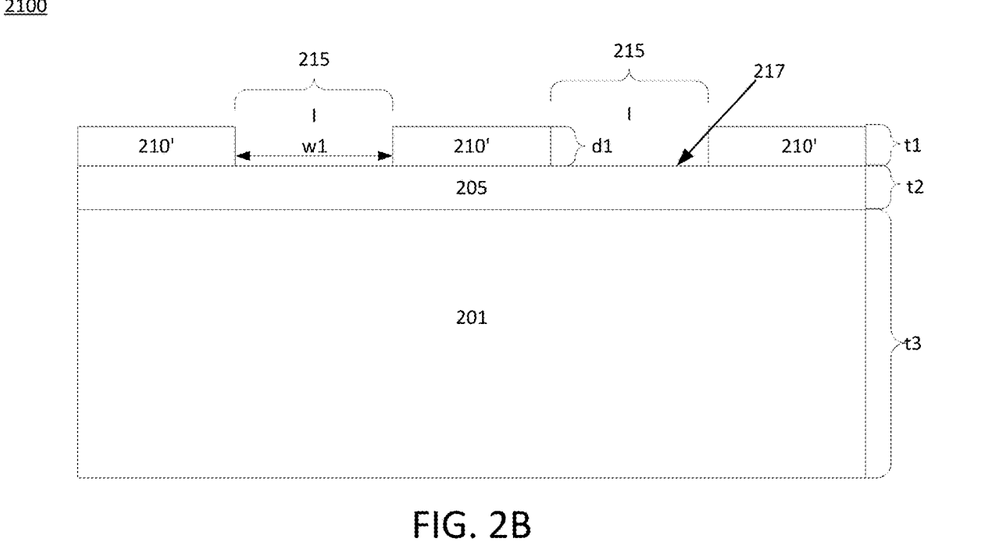

As shown in FIG. 2A, substrate 201 may have a thickness t3, which may be any suitable thickness. In general t3 may be selected or otherwise set such that high aspect ratio features may be formed in substrate 201 with desired dimensions. Without limitation, in some embodiments t3 is greater than the height of the high aspect ratio feature(s) that are to be formed in substrate 201 (e.g., h1 as shown in FIG. 2G).

In general, the layer of etch stop 205 may function to limit and/or prevent etching of substrate 201, e.g., during the etching of the layer of first hard mask material 210 (described later). That is, etch stop 205 may function to protect substrate 201 from a first etching chemistry that may be applied to etch the layer of first hard mask material 210. Therefore as described above, it may be desirable to form etch stop 205 from one or more materials that may be unaffected or substantially unaffected by the first etching chemistry used to etch the layer of first hard mask material 210.

In that regard the layer of etch stop 205 may be formed from any suitable etch stop material. Non-limiting examples of suitable etch stop materials include carbides, nitrides, and oxides, such as but not limited to those identified above as suitable for use in substrate 201. In some embodiments the layer of etch stop 205 is formed from or includes a material that is the same as or different from the material(s) used in substrate 201. For example the layer of etch stop 205 may be formed from or include an oxide, nitride, or carbide that is the same as or differs from the oxides, nitrides, and/or carbides that may be present in substrate 101. Without limitation, in some instances substrate 201 may be formed from or include an oxide, and the layer of etch stop 205 may be formed from or include the same or a different oxide. In further non-limiting embodiments, the layer of etch stop 205 is formed from or includes silicon, silicon dioxide, silicon nitride, titanium nitride, aluminum oxide, or a combination thereof. Without limitation, in some embodiments silicon dioxide is used to form the layer of etch stop 205.

As shown in FIG. 2A, the layer of etch stop 205 may have a thickness t2, which may be any suitable thickness. For example, in some embodiments t2 ranges from greater than 0 to about 50 nanometers (nm), such as from about 1 to about 30 nm, about 5 to about 20 nm, or even about 10 to about 15 nm. Of course such ranges are for the sake of example only, and thickness t2 may be set to any suitable value. Indeed in some instances it may be desirable to set t2 based on the selectivity of the etching chemistry(ies) that will be used to process workpiece 2000, and more specifically the etching chemistry(ies) that will be used to remove portions of first hard mask material 210, as described later.

First hard mask material 210 may generally function to provide a hard mask for the etching of etch stop 205 and/or substrate 201, e.g., with a second and/or third etching chemistry. For example and as will be explained in further detail below, in a first etching process the layer of first hard mask material 210 may etched with a first etching chemistry to expose regions of etch stop 205. Subsequently in a second etching process, the remaining regions 210' of first hard mask material may serve as a hard mask during the application of a second etching chemistry, which may be applied to etch the exposed regions of etch stop 205 and optionally substrate 201. In such instances the second etching chemistry may be tailored to etch the material of etch stop 205 and optionally substrate 201, while leaving regions 210' of first hard mask material substantially unaffected.

In instances where etching of substrate 201 is not performed (or is not completed) by the second etching process, a third etching process may be performed. As will be explained later, the third etching process may involve the application of a third etching chemistry. In such instances, the third etching chemistry may be tailored to etch substrate 201, which leaving regions 210' of first hard mask material and/or regions 205' of etch stop 205 substantially unaffected.

With the foregoing in mind, the layer of first hard mask material 210 may be formed from or include any suitable hard mask material. Non-limiting examples of such materials include amorphous silicon, as well as oxides, nitrides, and carbides such as those mentioned above as being suitable for use in substrate 201 and/or etch stop 205. Of course, first hard mask material 210 may be selected such that it exhibits desired etching properties. For example and as discussed above, first hard mask material 210 may be selected such that it may be etched by a first etching chemistry, while remaining substantially unaffected by a second and/or third etching chemistries that may be employed to remove etch stop 205 and/or substrate 201. Without limitation, in some embodiments the layer of first hard mask material 210 is formed from or includes amorphous silicon.

In more general terms, substrate 201 may be formed from or include a first material, etch stop 205 may be formed from or include a second material, and the layer of first hard mask material 210 may be formed form or include a third material, wherein the first, second and third materials are different from one another. Consistent with the foregoing description, a first etching chemistry may be used to etch the third material, but may not or may not substantially etch the second and/or first materials. A second etching chemistry may be used to etch the second and/or first materials, but may not or may not substantially etch the third material. In some embodiments, the second etching chemistry may be used to etch the second material, but may not or may not substantially etch the first and third materials. In such instances a third etching chemistry may be used to etch the first material, but may not or may not substantially etch the second and third materials.

With the foregoing in mind, for the sake of clarity and ease of understanding the present disclosure will proceed to describe an embodiment wherein workpiece 2000 includes a substrate 201 that is formed from or includes oxide, etch stop 205 is formed from or includes silicon dioxide (which may the same as or different from the oxide of substrate 201), and first hardmask material 210 is formed from amorphous silicon. It should be understood that such discussion is for the sake of example only, and that substrate 201, etch stop 205, and first hard mask material 210 may be formed form or include other materials as generally described above.

Returning to FIG. 1, once a workpiece has been provided according to block 105 (or if provision of a workpiece is not required), the method may proceed to block 110. Pursuant to block 110, one or more hole precursors may be formed in the layer of first hard mask material. This concept is illustrated in FIG. 2B, which depict modified workpiece 2100 as including hole precursors 215 which are defined between regions 210' of first hard mask material 210. As shown, hole precursors 215 extend through the thickness t1 of the layer of first hardmask material 210, so as to expose portions of the surface 217 of etch stop 205. As such, the depth d1 of hole precursors 215 may in some embodiments equal the thickness t1 of the layer of first hard mask material 210.

As further shown in FIG. 2B, hole precursors 215 have a width w1, which may be any suitable width. In some embodiments width w1 corresponds to a width w2 of high aspect ratio features that are to be formed on or within a surface of substrate 201, as will be described in detail later. Therefore in some embodiments, w1 may range from greater than 0 to about 50 nm, such as from about 2 nm to about 50 nm, about 5 nm to about 40 nm, or even about 10 nm to about 20 nm. Of course such ranges are for the sake of example only, and w1 may have any suitable value.

Hole precursors 215 (and subsequently, blind holes 216) may also have any suitable geometry. For example in some embodiments hole precursors 215 and/or blind holes 216 may have a triangular, quadrilateral (e.g., square, rectangular, trapezoidal), pentagonal, hexagonal, or other geometry when viewed from the top down. In such instances width w1 may be defined as the longest dimension between two opposing positions of one or more sidewalls of hole precursor 215. For example in instances where hole precursors 215 have a circular geometry, width w1 may be defined as the circumference of hole precursor. Alternatively where hole precursors 215 have a quadrilateral or other multisided geometry, w1 may be defined as the longest distance between two opposing or substantially opposing sides of the hole precursor. The same considerations may be applied with regard to the width of blind holes described herein.

Finally, while the FIGS. illustrate embodiments in which the sidewalls of hole precursors 215 are oriented perpendicular to surface 217, the present disclosure envisions embodiments in which in the sidewalls of hole precursors 215 (and/or blind holes 216) are oriented at an angle relatively to surface 217, such that hole precursors 215 have a tapered cross section. In such instances w1 may be defined as the largest distance between two opposing points along the sidewall(s) of hole precursor(s) 215. Similar considerations may be applied with regard to blind holes 216.

Any suitable process may be used to form hole precursors 215. Without limitation, in some embodiments a lithographic process may be used to form a pattern of hole precursors 215 surrounded by regions 210' of first hard mask material 210. For example, hole precursors 215 may be formed by depositing a layer of photoresist (not shown) onto the layer of first hard mask material 210 of workpiece 2000. Following such deposition, the photoresist may be masked and exposed to (e.g., ultraviolet) light. Such exposure may define regions within the photoresist layer that correspond to first locations (I) locations at which hole precursors are to be formed. As shown, hole precursors 215 may have a depth d1 that substantially corresponds to a thickness t1 of the layer of first hardmask material 210. The photoresist layer may then be processed to expose portions of the surface of the layer of first hardmask material 210 corresponding to such locations. The resulting structure may then may then be processed to selectively remove first hard mask material from the exposed portions thereof, resulting in the production of hole precursors 215.

For example, in some embodiments the exposed portions of the layer of first hard mask material 215 may be exposed to a first (wet or dry) etching chemistry. As mentioned previously, the first etching chemistry may etch hard mask material 215, but may not or may not substantially etch the etch stop 205. In instances where first hard mask material is amorphous silicon and etch stop 205 is silicon dioxide for example, the first etching chemistry may be configured to selectively etch amorphous silicon, without or without substantially etching silicon dioxide. As one example of an etching chemistry that may anisotropically etch amorphous silicon without or without substantially etching silicon dioxide, non-limiting mention is made of a mixture of hydrogen bromide and oxide. Of course, such etching chemistry is identified for the sake of example only and other etching chemistries may be suitably used.

Furthermore and as may be appreciated from FIGS. 2A and 2B, the first etching chemistry in some embodiments may be configured to anisotropically etch first hard mask material 215, resulting in the formation of hole precursors 215 with one or more sidewalls that are substantially perpendicular to surface 217 of etch stop 205. This concept is shown in FIG. 2B, which depicts hole precursors 215 as being formed at locations I, wherein the hole precursors 215 are defined by remaining regions 210' of the first hardmask material that are present after execution of the first etching process. Of course, other processes may be used to form hole precursors 215, as may be understood in the art.

Figure 3:
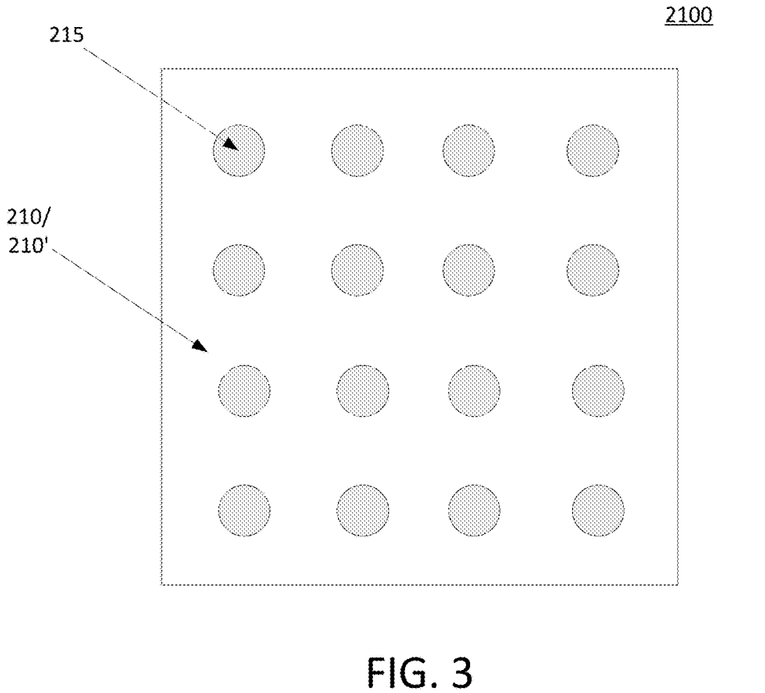
FIG. 3 illustrates a top down view of a modified workpiece consistent with FIG. 2B.

It is noted that for the sake of clarity and ease of understanding, FIG. 2B depicts the formation of a limited number (in this case, two) hole precursors 215. It should be understood that this is for the sake of illustration only, and that any number of hole precursors may be formed. Indeed in some embodiments processing of substrate 200 may result in the production of a (first) pattern of hole precursors within the layer of first hard mask material 210. This concept is shown in FIG. 3, which depicts one example of a pattern of hole precursors 215 formed in a layer of first hard mask material 210. Of course other patterns are possible and are contemplated by the present disclosure.

Returning to FIG. 1, following the production of hole precursors the method may proceed from block 110 to block 115. Pursuant to block 115, the hole precursors formed pursuant to block 105 may be transferred to substrate 201. For example and with reference to FIGS. 2B and 2C, modified workpiece 2100 may be processed so as to selectively remove portions of etch stop 205 that are proximate portions of surface 217 that are exposed by hole precursor 215, thereby extending hole precursors 215 through the layer of etch stop 205. Simultaneously or subsequently, portions of the substrate beneath the bottom surface of hole precursor(s) 215 may also be selectively removed, resulting in the production of blind holes that extend from an upper surface of the layer of first hard mask material 210, through etch stop 205, and at least partially through the thickness t3 of substrate 201. This concept is shown in FIG. 2C, which illustrates modified workpiece 2200 as including blind holes 216 extending through regions 210' of first hardmask material 210, through etch stop 205 (and remaining regions 205' thereof), and into substrate 201.

For the sake of clarity, it is noted that the term "blind hole" refers to a hole which extends only part way through the thickness of one or more components of a workpiece, e.g., substrate 201. For example as shown in FIG. 2C, blind holes 216 are illustrated as extending partially through the thickness of substrate 201.

Figure 2C:
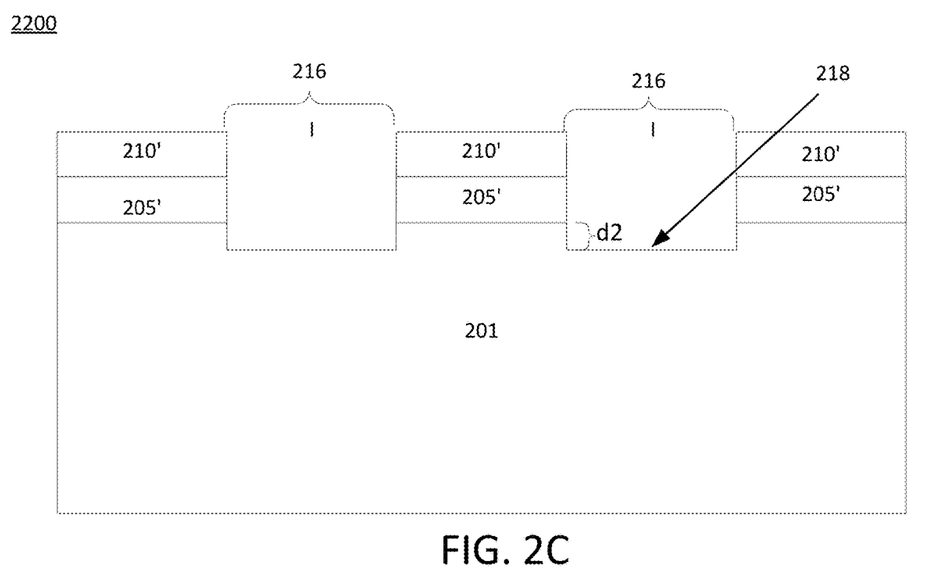

As further shown in FIG. 2C, blind holes 216 may extend into substrate 201 to a depth, d2. In this regard, d2 may be any suitable depth, provided it is less than thickness t3 of substrate 201, e.g., prior to the formation of blind holes 216. In some embodiments, depth d2 is defined as a distance from an upper surface of substrate 210 proximate a sidewall of a blind hole 216 to a bottom of blind hole 216 proximate that sidewall, as shown in FIG. 2C. In any case, d2 may range from about 5 nm to about 200 nm, such as about 25 to about 100 nm, or even about 50 to about 75 nm. Of course such ranges are enumerated for the sake of example only, and d2 may be any suitable depth. In some embodiments, d2 may be the same as, substantially the same as, or different from the height (h1) of corresponding high aspect ratio structure to be formed in substrate 201, as discussed later. Without limitation, in some embodiments d1 is the same or substantially the same as h1. In other embodiments, d1 is different from h1, such as but not limited to less than h1.

The structure of FIG. 2C may be produced in any suitable manner. For example, in some embodiments modified workpiece 2200 may be produced by subjecting modified workpiece 2100 to a second etching process, so as to selectively remove portions of etch stop 205 proximate a bottom of hole precursor(s) 215. In this regard, the exposed portions of the surface 217 of etch stop 205 may be exposed to a second (wet or dry) etching chemistry, wherein the second etching chemistry is designed to selectively etch exposed portions of etch stop 205, but to not etch (or not substantially etch) regions 210' of first hard mask material 215.

For example in instances where etch stop 205 includes silicon dioxide and regions 210' include amorphous silicon, a fluorocarbon etching chemistry may be used to selectively etch the silicon dioxide of etch stop 205, without or without substantially etching the amorphous silicon of regions 210' of first hard mask material 210. For example, selective etching of silicon dioxide could be performed by exposing modified workpiece to an etchant containing $C_xF_y$, wherein x ranges from 3 to 5 and y ranges from 6 to 8. Of course, other etching chemistries that can selectively remove etch stop 205 without substantially affecting first hard mask material 210 may also be used.

As noted previously, in some embodiments the second etching process may be designed to employ an etching chemistry that can selectively remove material from both etch stop 205 and substrate 201. In such instances, the second etching chemistry may be applied for a sufficient time to etch through the thickness of etch stop 205 and into substrate 201, e.g., to a desired depth d2. For example where etch stop 205 includes silicon dioxide and substrate 201 includes oxide, the second etch chemistry may be designed to selectively etch the silicon dioxide of etch stop 205 and the oxide of substrate 201, e.g., at the same or different etch rates.

Alternatively in some embodiments the second etching chemistry may be designed to selectively remove the material of etch stop 205, without substantially affecting first hard mask material 210 and substrate 201. In such instances it may be appreciated that execution of the second etching process may extend hole precursors 215 down to an upper surface of substrate 201. In those cases, the resulting structure may be further processed to extend hole precursors into substrate 201 to form blind holes 216. This may be accomplished, for example, by the execution of a third etching process that selectively removes material from exposed regions of substrate 201, without or without substantially affecting regions 205' of etch stop 205, and/or regions 210' of first hardmask material 210.

For example in instances where regions 210' include amorphous silicon, regions 205' include titanium nitride, and substrate 201 is an oxide, the third etching chemistry may be designed to selectively remove the oxide of substrate 201, without or without substantially removing titanium nitride and amorphous silicon.

Figure 2D:
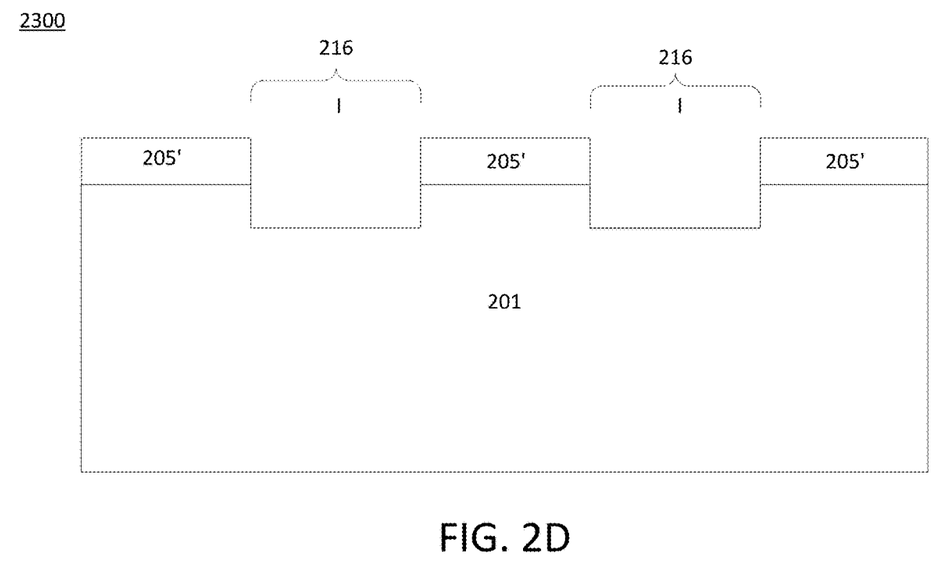

Returning to FIG. 1, once operations pursuance to block 115 are complete the method may proceed to block 120, pursuant to which the regions 210' of first hard mask material 210 may be removed. This concept is illustrated in FIG. 2D, which illustrates modified workpiece 2300 as including substrate 201, regions 205' of etch stop 205, and blind holes 216 extending through regions 205' and into substrate 201.

Removal of the regions 210' may be accomplished in any suitable manner. For example, regions 210' may be removed by the execution of a fourth etching process on modified workpiece 2200. The fourth etching process may be designed to selectively remove regions 210' of first hardmask material 210, without or without substantially affecting regions 205' of etch stop 205 and/or substrate 201. For example, the fourth etching process may involve exposing workpiece 2200 a fourth (e.g., dry) etching chemistry (e.g., hydrogen bromide and oxygen) that selectively and isotropically etches first hard mask material 210, but which does not substantially affect regions 205' or substrate 201. Alternatively the fourth etching process may involve exposing workpiece 2200 a fourth (e.g., wet) etch chemistry that selectively and anisotropically etches first hard mask material 210, but which does not substantially affected regions 205' or substrate 201. Alternatively or additionally, a planarization process such as chemical mechanical planarization may be used to remove regions 210'.

Figure 2E:
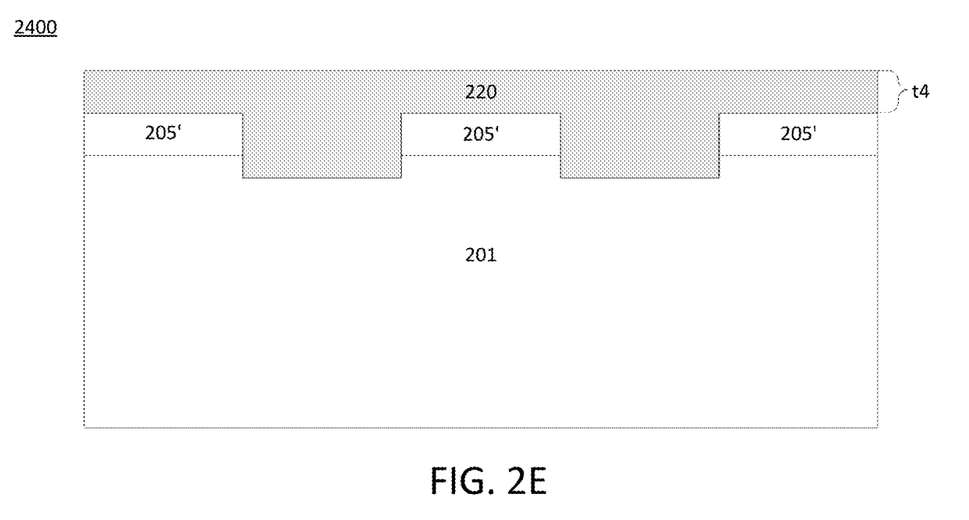

Returning to FIG. 1, after regions 210' are removed the method may proceed from block 120 to block 125. Pursuant to block 125, a second hardmask material may be deposited over the exposed surfaces of regions 205' and substrate 201, e.g., so as to fill blind holes 216. This concept is illustrated in FIG. 2E, which depicts modified workpiece 2400 as including a layer of second hardmask material 220. As shown, second hardmask material 220 may be present on the upper surface of regions 205' and the upper surface of substrate 201, e.g., so as to fill blind holes 216.

As will be described in detail below, the second hardmask material 220 may function to define regions of substrate 201 at which high aspect ratio structures are to be formed. Thus for example, second hardmask material 220 may function to protect or otherwise isolate regions of substrate 201 during the production of such structures, e.g., by a wet or dry etching process.

With the foregoing in mind, second hardmask material 220 may be formed from any suitable hardmask material. Non-limiting examples of materials that may be used as second hardmask material 220 include oxides, carbides, and nitrides, such as those identified as suitable for use as etch stop 205 and/or first hardmask material 210. Without limitation, in some embodiments second hardmask material 220 is different from the material used in first hardmask material 210. For example where first hardmask material 210 is or includes amorphous silicon, second hardmask material 220 may be or include an oxide, carbide, or nitride, such as but not limited to silicon or titanium oxide, carbide, or nitride. Without limitation, in some embodiments first hardmask material 210 is or includes amorphous silicon, and second hardmask material 220 is or includes silicon carbide.

As will become apparent from the following discussion, second hardmask material 220 may be selected such that it may be substantially unaffected during the production of high aspect ratio features. For example where an etching process is employed to remove regions 205' and underlying portions of substrate 201 from modified workpiece 2400, second hardmask material 220 may be selected such that it is substantially unaffected by the etching chemistry employed in such a process. Alternatively or additionally, the etching chemistry employed in such a process may be designed to selectively etch regions 205' and underlying portions of substrate 201, without or without substantially etching second hardmask material 220.

Regardless of its nature, second hardmask material 220 may be deposited on modified workpiece 2300 in any suitable manner. For example second hardmask material 220 may be deposited by chemical vapor deposition, physical vapor deposition, atomic layer deposition, reactive sputtering, combinations thereof, and the like. Without limitation, in some embodiments second hardmask material 220 is deposited by plasma enhanced chemical vapor deposition.

Figure 2F:
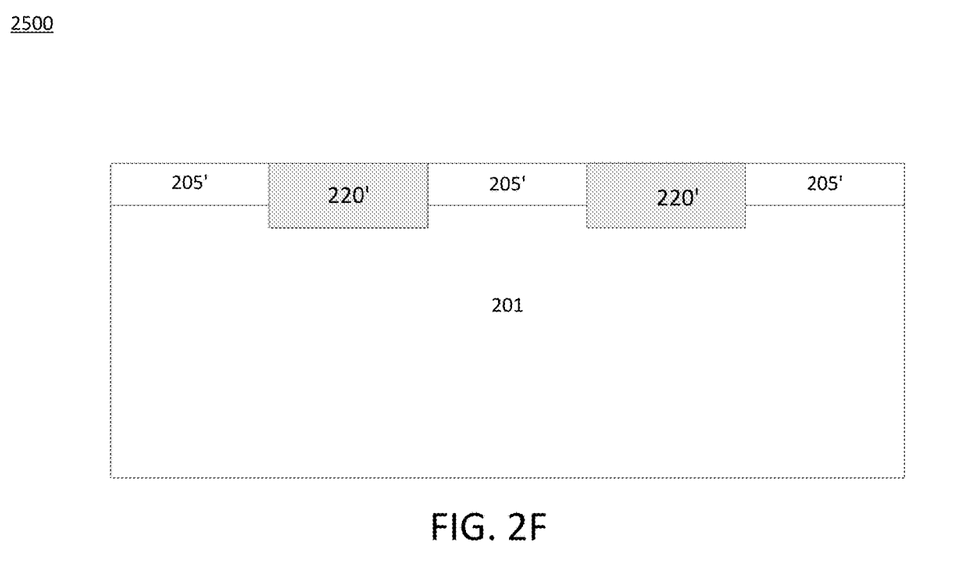
Figure 2G:
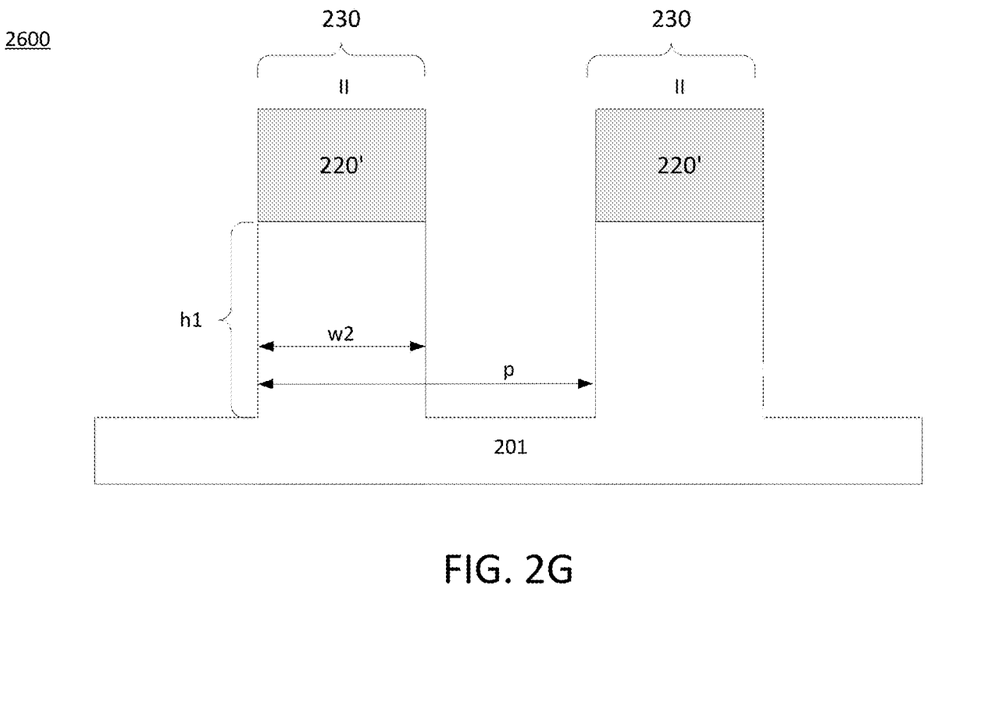

Returning to FIG. 1, once second hardmask material 220 has been provided the method may proceed from block 125 to block 130, pursuant to which a planarization process may be performed. One purpose of the planarization process may be to remove a portion of second hardmask material 220, so as to expose an upper surface of regions 205' of etch stop 205. This concept is illustrated in FIG. 2F, which depicts modified workpiece 2500 which is substantially the same as modified workpiece 2400 except insofar as portions of second hardmask material have been removed to expose the surface of regions 205' of etch stop 205. Following such planarization, regions 220' of second hardmask material 220 may remain within blind holes 216 (not labeled in FIG. 2F) in substrate 201

Planarization of modified workpiece 2400 may be performed in any suitable manner. For example, modified workpiece 2400 may be subjected to a fifth etching process, during which a fifth etching chemistry may be applied to selectively etch (isotropically or anistropically) second hardmask material 220. Control over the process conditions (e.g., time, temperature, etc.) may be performed to limit the amount of second hardmask material 220 that is removed to the thickness of the portion of second hardmask material 220 that is disposed over the surface of regions 205'.

Alternatively or additionally a polishing process may be performed to remove the thickness t4 of second hardmask material 200, thereby exposing the surface of regions 205' while leaving behind regions 220'. For example, chemical mechanical planarization may be performed to selectively remove the thickness t4 of second hardmask material 220, while leaving regions 220' and 205' intact.

Returning to FIG. 1, following planarization the method may proceed from block 130 to block 135, pursuant to which one or more high aspect ratio structures may be formed. With reference to FIGS. 2F and 2G, high aspect ratio structures (HARS) may be formed by processing modified workpiece 2500 to selectively remove regions 205' of etch stop 205 and underlying portions of substrate 201, while leaving regions 220' and portions of substrate 201 underlying regions 200' intact. The result of such processing may be the formation of HARS 230 that include portions of substrate 201 that are located beneath regions 220' of second hardmask material 220. This concept is illustrated in FIG. 2G, which depicts modified workpiece 2600 as including HARS 230. As shown in the illustrated embodiment, HARS 230 include regions 220' of second hardmask material 220, as well as underlying portions of substrate 201.

HARS 230 may be formed in any suitable manner. For example, such structures may be formed by selectively removing regions 205' and underlying portions of substrate 201, e.g., using an etching or other suitable process. In such instances, it may be appreciated that regions 220' of second hardmask material 220 may act as a mask to protect the underlying portions of substrate 201 during the selective removal of regions 205', as well as during the removal of the portions of substrate 201 underlying regions 205'.

For example, selective removal of etch stop 205' and underlying portions of substrate 201 may be accomplished by executing a sixth etching process on modified workpiece 2500. In general, the sixth etching process may include contacting modified workpiece 2500 with a sixth etching chemistry that may selectively remove regions 205' of etch stop 205, and/or portions of substrate 201. In this regard, in some instances the sixth etching chemistry may be the same or similar as the second and/or third etching chemistries noted above. In such instances, second hardmask material 220' may be selected such that it is not or is not substantially etched by the second and/or third etching chemistries noted above. Alternatively or additionally the sixth etching chemistry may be different from the second and third etching chemistries noted above, but may still selectively etch regions 205' and underlying regions of substrate 201, while leaving regions 200' substantially unaffected.

For example in instances where substrate 201 is or includes oxide, regions 205' are or include silicon dioxide, and regions 220' are or include silicon carbide, the sixth etching chemistry may be designed to selectively etch the silicon dioxide of regions 205' and the oxide of substrate 201, while leaving the silicon carbide of regions 220' substantially unaffected. As one non-limiting example of a sixth etching chemistry that may be used in such an example, mention is made of fluorocarbon etchants such as the $C_xF_y$ etchants noted above.

As shown in the embodiment of FIG. 2G, recessing of portions of substrate 201 below regions 205' may result in the formation of HARS 230, wherein HARS 230 includes an elevated portion of substrate 201 that is topped by a region 220' of second hard mask material. In such instances the elevated portion of substrate 201 may have a height h1, which may be any suitable height. Without limitation, in some embodiments h1 may range from greater than 0 to about 250 nm, such as about 1 to about 100 nm, or even about 5 to about 50 nm. Without limitation, in some embodiments h1 ranges from about 10 to about 50 nm.

As further shown, the elevated portions of substrate 201 in HARS 230 may have a width w2, which may be any suitable width. Without limitation, width w2 in some embodiments substantially corresponds with width w1 of the hole precursors 215 formed earlier in the process, e.g., as shown and described above in conjunction with FIG. 2B. Thus for example, width w2 may range from greater than 0 to about 50 nm, such as from about 2 to about 40 nm, about 5 to about 30 nm, or even about 10 to about 20 nm.

Figure 4:
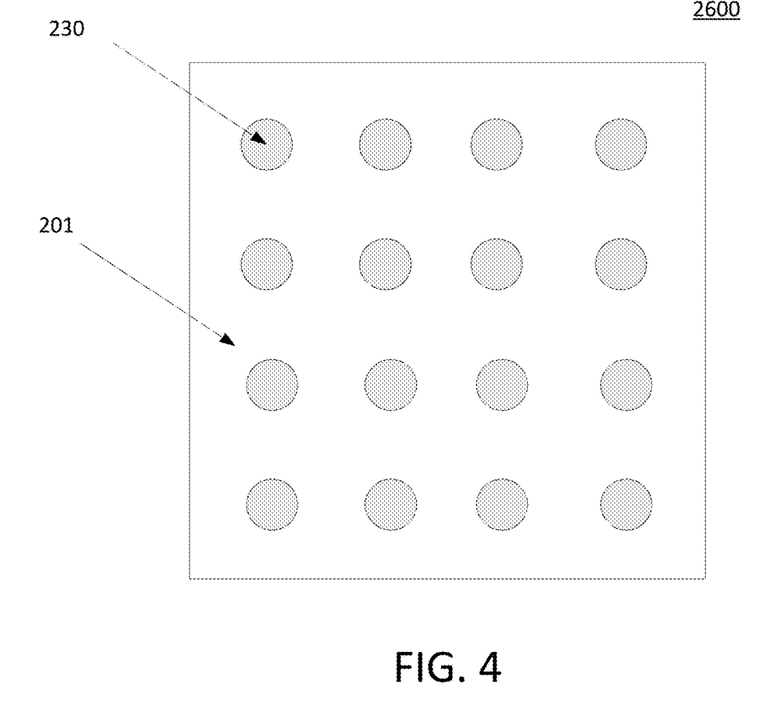
FIG. 4 illustrates a top down view of a workpiece including one or more high aspect ratio structures consistent with FIG. 2G.

As further shown in FIG. 2G, HARS 230 may be formed at location II relative to substrate 101. From a comparison of FIG. 2G to FIG. 2B, it may be seen that location II may substantially correspond to location I described above. As such, it may be appreciated that the methods described herein may involve the inversion of a lithographic pattern of hole precursors to form high aspect ratio structures at substantially the same location relative to substrate 201. This concept may be seen in FIGS. 3 and 4, which provide top down views of modified workpieces 2100 and 2600, respectively. More specifically, FIG. 3 illustrates a lithographic pattern of hole precursors 215 formed in regions 210' of first hard mask material 210. In contrast, FIG. 4 depicts the location of HARS 230 relative to substrate 201. As can be seen, HARS 230 in FIG. 4 are present at the same or substantially the same location hole precursors 215, relative to substrate 201.

As further shown in FIGS. 2G and 4, a plurality of HARS 230 may be formed by the processes described herein. In such instances, HARS 230 may have a pitch p. Pitch p may vary considerably, and may be set based on design considerations such as the nature of the device in which HARS 230 is to be employed. That being said, in some embodiment p may range from about 5 to about 500 nm, such as about 30 to about 100 nm, or even about 30 to about 50 nm. Of course such ranges are for the sake of example only, and any suitable pitch may be used.

As noted above, previous lithographic techniques could be used to produce HARS with a minimum feature size (e.g., width) below 50 nm, but which may vary considerable from a relevant design specification. For example, such processes may be employed to produce features that have a certain designed minimum feature size, but upon execution may produce high aspect ratio structures exhibiting a minimum feature size that exhibit an unacceptably high deviation from the designed minimum feature size. With the foregoing in mind, the processes of the present disclosure may be suitably used to produce high aspect ratio structures that have a minimum feature size below about 50 nm, and which may differ from a design specification by less than or equal to about 10%, such as less than or equal to about 5%, about 1% or even less than or equal to about 0.5%.

As may be appreciated from the foregoing, the technologies described herein may enable the production high aspect ratio structures by inverting a lithographic pattern of hole precursors. As described above, such technologies may be leveraged to produce high aspect ratio structures having a minimum feature size below about 50 nm, within acceptable design thresholds.

Another aspect of the present disclosure relates to semiconductor devices including high aspect ratio structures consistent with the present disclosure, such as those having the structure shown in FIGS. 2G, 3, and 4 described above. In some embodiments, the semiconductor devices include at least one high aspect ratio structures that includes a base and a hard mask layer formed on the base. In such embodiments the hard mask layer may be formed from one or more of the materials noted above as being suitable for use as the second hard mask material 220. Without limitation, in some embodiments the hard mask layer on the high aspect ratio structure is or includes silicon carbide, though of course other hard mask materials may also be used.

In some embodiments the high aspect ratio structure may be formed on or from a substrate, such as substrate 201 noted above. With that in mind, in some embodiments the high aspect ratio structure in some embodiments may be included in an interconnect layer of the semiconductor device. For example, the semiconductor device may include an interconnect layer including a plurality of vias, and the high aspect ratio structure may be included in such a device as a via plug. Alternatively or additionally, the semiconductor device may include one or more non-planar transistors, such as one or more non-planar FINFETS. In such instances the high aspect ratio structure may be included in such transistors, e.g., as one or more fins thereof.

In any case the high aspect ratio structures in the semiconductor devices described herein may have a height, width, and/or pitch that is consistent with the above description of the methods of the present disclosure. For example in some instances the high aspect ratio structures may have a width w2, which may range from greater than 0 to about 50 nm, such as from about 2 to about 40 nm, about 5 to about 30 nm, or even about 10 to about 20 nm.

Likewise the high aspect ratio structures may have a pitch, p, which may vary considerably, and may be set based on design considerations such as the nature of the semiconductor device in which the high aspect ratio structure is included. That being said, in some embodiment p may range from about 5 to about 500 nm, such as about 30 to about 100 nm, or even about 30 to about 50 nm. Of course such ranges are for the sake of example only, and any suitable pitch may be used.

Another aspect of the present disclosure relates to a computing device including integrated circuit devices that include high aspect ratio structures consistent with the present disclosure. In this regard reference is made to FIG. 5, which illustrates a computing device 500 in accordance with various embodiments of the present disclosure. As shown, computing device 500 includes motherboard 802, which may include various components such as but not limited a processor 404, communications circuitry (COMMS) 506, any or all of which may be physically and electronically coupled with motherboard 502.

Figure 5:
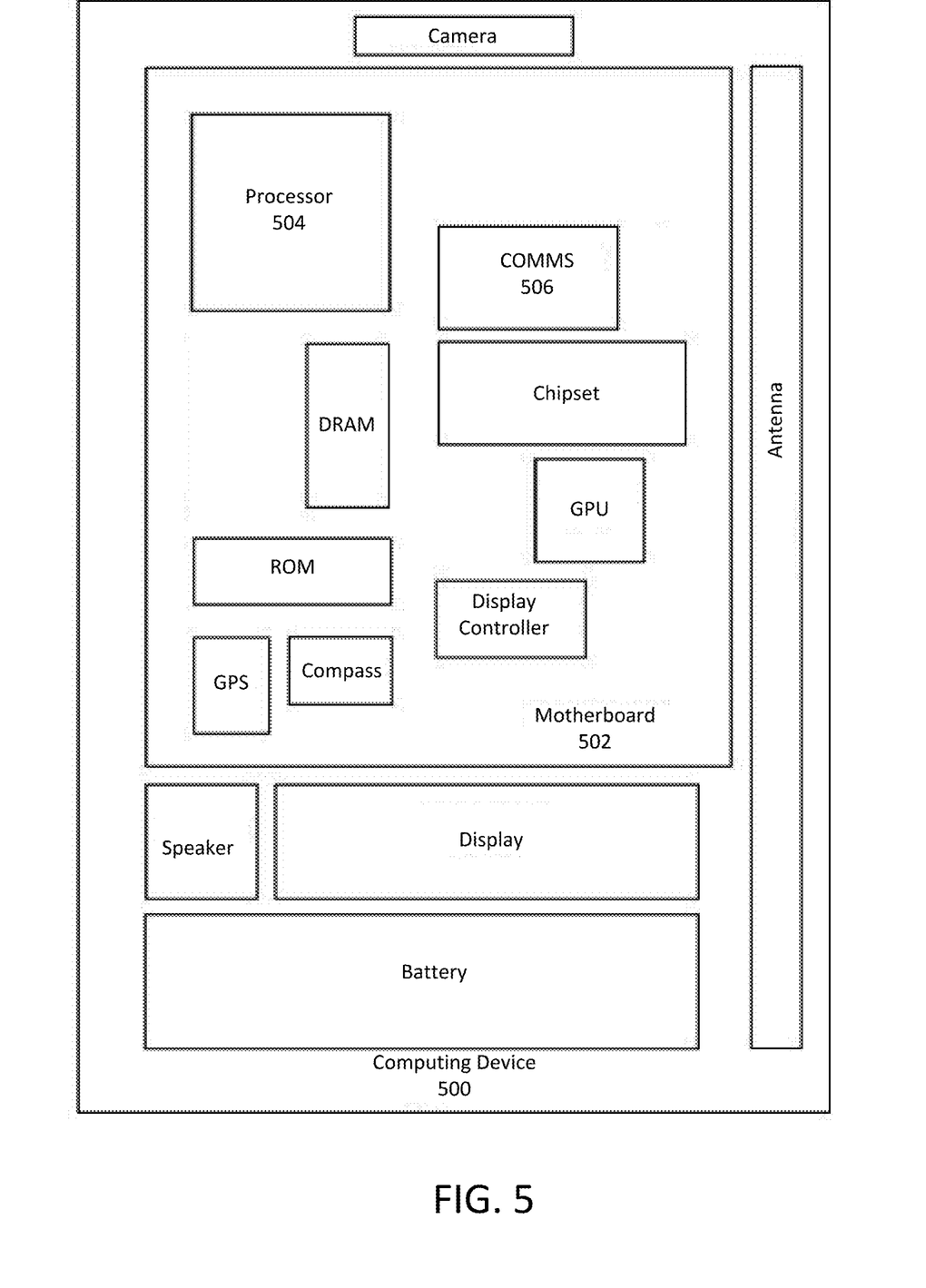
FIG. 5 is a block diagram of one example of a computing device including semiconductor devices that include high aspect ratio structures consistent with the present disclosure.

Depending on its application, computing device 500 may also include other components, such as but not limited to volatile memory (e.g., DRAM), non-volatile memory (e.g., ROM), flash memory, a graphics processor, a digital signal processor, a crypto processor, a chipset, an antenna, a display, a touchscreen controller, a battery, various codecs, various sensors (e.g., a global positioning system (GPS), accelerometer, gyroscope, etc.), one or more speakers, a camera, and/or a mass storage device.

COMMS 406 may be configured to enable wired or wireless communication for the transfer of data to and from the computing device 400. In some embodiments, COMMS 406 may be configured to enable wireless communications via any of a number of wireless standards or protocols, including but not limited to Wi-Fi (IEEE 802.11 family), WiMAX (IEEE 802.16 family), IEEE 802.20, long term evolution (LIE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond.

High aspect ratio structures consistent with the present disclosure may be included in integrated circuit dies that may be present in various components of computing device 500. For example, in some embodiments processor 504 may include an integrated circuit die that includes one or more memory devices, wherein such memory devices may include high aspect ratio structures such as those described herein. Likewise, COMMS 406 may include an integrated circuit die that may include high aspect ratio structures such as those described herein. Moreover, various other memories of computing device 500 (e.g., DRAM, ROM, mass storage, etc.) may include high aspect ratio structures such as those described herein.

Computing device 500 may any or a wide variety of computing devices, including but not limited to a laptop computer, a nethook computer, a notebook computer, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder, combinations thereof, and the like. Of course such devices are enumerated for the sake of example only, and computing device 500 may be any suitable type of mobile or stationary electronic device.

The following examples represent additional non-limiting embodiments of the present disclosure.

Example 1

According to this example there is provided a method for forming high aspect ratio structures, including: providing a modified workpiece, the modified workpiece including a substrate, an etch stop layer on a surface of the substrate, and at least one blind hole extending through the etch stop layer and partially into the substrate, the at least one blind hole located at a first position relative to the substrate; forming a second hardmask material within the at least one blind hole; and forming a high aspect ratio structure beneath the second hardmask material at least in part by selectively removing regions of the etch stop layer proximate the second hardmask material and at least a portion of the substrate below the regions of the etch stop layer; wherein the high aspect ratio structure is formed at a second location relative to the substrate, the second location corresponding to the first location.

Example 2

This example includes any or all of the features of example 1, wherein forming the second hardmask material includes: depositing the second hardmask material on the modified workpiece such that the second hardmask material is disposed on an upper surface of the etch stop layer and within the at least one blind hole; and removing at least a portion of the second hardmask material to expose the upper surface of the etch stop layer proximate the at least one blind hole.

Example 3

This example includes any or all of the features of example 2, wherein removing at least a portion of the second hardmask material is performed at least in part by chemical mechanical planarization.

Example 4

This example includes any or all of the features of example 1, wherein forming the high aspect ratio structure includes etching the modified workpiece to selectively remove the regions of the etch stop layer and at least a portion of the substrate below the regions of the etch stop layer.

Example 5

This example includes any or all of the features of example 4, wherein the second hardmask material is unaffected or substantially unaffected by the etching to selectively remove the regions of the etch stop layer and at least a portion of the substrate below the regions of the etch stop layer.

Example 6

This example includes any or all of the features of example 1, wherein: the at least one blind hole includes a plurality of blind holes; forming the second hardmask material includes forming a plurality of second hardmask regions, each of the second hardmask regions being disposed within a respective one of the plurality of blind holes; and forming the high aspect ratio structure includes forming a plurality of high aspect ratio structures, wherein each one of the plurality of high aspect ratio structures is disposed beneath a respective one of the second hardmask regions.

Example 7

This example includes any or all of the features of example 1, wherein providing the modified workpiece includes: forming at least one hole precursor in a workpiece, the workpiece including the substrate, the etch stop layer on the substrate, and a layer of first hard mask material on the etch stop layer, the hole precursor extending through the layer of first hard mask material to expose a portion of a surface of the etch stop layer within the hole precursor; and forming the at least one blind hole by selectively removing at least a portion of the etch stop layer exposed within the hole precursor and a portion of the substrate underlying the hole precursor.

Example 8

This example includes any or all of the features of example 7, wherein forming the at least one hole precursor includes exposing the workpiece to a first etching chemistry that is configured to selectively remove at least a portion of the layer of first hard mask material to expose the portion of a surface of the etch stop layer.

Example 9

This example includes any or all of the features of example 8, wherein the etch stop layer is unaffected or substantially unaffected by the first etching chemistry.

Example 10

This example includes any or all of the features of example 8, wherein: the first hardmask material includes amorphous silicon; the etch stop layer includes an oxide; and the first etching chemistry is configured to selectively etch amorphous silicon without or without substantially etching the oxide of the etch stop layer.

Example 11

This example includes any or all of the features of example 8, wherein exposing the workpiece to the first etching chemistry includes exposing the workpiece to a mixture of hydrogen bromide and oxygen.

Example 12

This example includes any or all of the features of example 8, wherein forming the at least one blind hole includes exposing the workpiece to a second etching chemistry that is different from the first etching chemistry, the second etching chemistry configured to selectively remove at least a portion of the etch stop layer exposed within the hole precursor and a portion of the substrate underlying the hole precursor.

Example 13

This example includes any or all of the features of example 12, wherein the first hardmask material is unaffected or substantially unaffected by the second etching chemistry.

Example 14

This example includes any or all of the features of example 12, wherein: the first hardmask material includes amorphous silicon; the etch stop layer includes an oxide; and the second etching chemistry is configured to selectively etch the oxide of the etch stop layer without or without substantially etching amorphous silicon.

Example 15

This example includes any or all of the features of example 12, wherein exposing the workpiece to the second etching chemistry includes exposing the workpiece to one or more carbon and fluorine containing etchants of the formula $C_xF_y$, wherein x is an integer ranging from 3 to 5 and y is an integer ranging from 6 to 8.

Example 16

This example includes any or all of the features of example 1, wherein the at least one high aspect ratio structure has a height to width ratio ranging from greater than 1:1 to about 100:1.

Example 17

This example includes any or all of the features of example 1, wherein the at least one blind hole and the high aspect ratio structure have a width ranging from greater than 0 to less than or equal to about 50 nanometers (nm).

Example 18

This example includes any or all of the features of example 17, wherein the high aspect ratio structure has a width ranging from 10 to about 20 nm.

Example 19

This example includes any or all of the features of example 1, wherein the second location is the same as the first location.

Example 20

This example includes any or all of the features of example 1, wherein the at least one hole precursor has a circular or multisided geometry.

Example 21

This example includes any or all of the features of example 1, further including removing the second hardmask material after forming the at least one high aspect ratio structure.

Example 22

This example includes any or all of the features of example 1, wherein the substrate is formed from a first material selected from the group consisting of a silicon, polysilicon, a compound semiconductor, an oxide, a nitride, a carbide, or one or more combinations thereof.

Example 23

This example includes any or all of the features of example 22, wherein the first material is an oxide.

Example 24

This example includes any or all of the features of example 1, wherein the etch stop layer is formed from a second material selected from the group consisting of an oxide, a nitride, or carbide, or one or more combinations thereof.

Example 25

This example includes any or all of the features of example 4, wherein the second material is an oxide.

Example 26

This example includes any or all of the features of example 1, wherein the layer of second hardmask material includes one or more of an oxide, carbide, or nitride.

Example 27

This example includes any or all of the features of example 26, wherein the layer of second hardmask material includes silicon carbide.

Example 28

This example includes any or all of the features of example 7, wherein the layer of first hardmask material includes amorphous silicon, an oxide, a carbide, or a nitride.

Example 29

This example includes any or all of the features of example 7, wherein the layer of first hardmask material and the layer of second hardmask material are formed from different materials.

Example 30

This example includes any or all of the features of example 29, wherein the layer of first hardmask material is formed from amorphous silicon and the layer of second hardmask material is formed from an oxide, a carbide, or a nitride.

Example 31

This example includes any or all of the features of example 30, wherein the layer of second hardmask material is formed from silicon carbide.

Example 32

According to this example there is provided a semiconductor device including a substrate having a high aspect ratio structure formed thereon, wherein the high aspect ratio structure includes a base and a hardmask layer formed on the base.

Example 33

This example includes any or all of the features of example 32, wherein the high aspect ratio structure has a height:width ratio of greater than 1:1 to about 100:1.

Example 34

This example includes any or all of the features of example 32, wherein the hardmask layer includes a silicon hard mask.

Example 35

This example includes any or all of the features of example 34, wherein the silicon hardmask includes silicon carbide.

Example 37

This example includes any or all of the features of example 32, wherein: the semiconductor device includes at least two high aspect ratio structures that are spaced from one another by a gap; a pitch between the two high aspect ratio structures is defined between an outer edge of a first of the two high aspect ratio structures and an inner edge of a second of the two high aspect ratio structures, wherein a pitch between the each of each plurality of high aspect ratio structures; and the pitch ranges from about 5 to about 500 nanometers (nm).

Example 38

This example includes any or all of the features of example 36, wherein the pitch ranges from about 30 to about 50 nm.

Example 39

This example includes any or all of the features of example 32, wherein the semiconductor device is a non-planar transistor, and the high aspect ratio structure is included in the non-planar transistor.

Example 40

This example includes any or all of the features of example 38, wherein the non-planar transistor is a fin based field effect transistor (FINFET), and the high aspect ratio structure forms all or a part of a fin of the FINFET.

Example 41

This example includes any or all of the features of example 32, wherein the semiconductor device includes an interconnect layer including one or more vias, and the high aspect ratio structure is included in the interconnect layer as a via plug.

The terms and expressions which have been employed herein are used as terms of description and not of limitation, and there is no intention, in the use of such terms and expressions, of excluding any equivalents of the features shown and described (or portions thereof), and it is recognized that various modifications are possible within the scope of the claims. Accordingly, the claims are intended to cover all such equivalents. Various features, aspects, and embodiments have been described herein. The features, aspects, and embodiments are susceptible to combination with one another as well as to variation and modification, as will be understood by those having skill in the art. The present disclosure should, therefore, be considered to encompass such combinations, variations, and modifications.

The invention claimed is:

1. A method for forming a semiconductor device, comprising:
   providing a first workpiece comprising a substrate, an etch stop layer on a surface of the substrate, and a blind hole extending through the etch stop layer and partially into the substrate;
   forming a first hardmask material within the blind hole; and
   forming a structure extending from the surface of the substrate beneath the first hardmask material, at least in part, by selectively removing regions of the etch stop layer proximate the first hardmask material and at least a portion of the substrate below the etch stop layer;
   wherein the structure extending from the surface of the substrate is formed at a location of the blind hole.

2. The method of claim 1, wherein forming the first hardmask material comprises:
   depositing the first hardmask material on the first workpiece such that the first hardmask material is disposed on an upper surface of the etch stop layer and within the blind hole; and
   removing at least a portion of the first hardmask material to expose the upper surface of the etch stop layer proximate the blind hole.

3. The method of claim 1, wherein providing the first workpiece comprises:
   forming a hole precursor in a second workpiece, the second workpiece comprising the substrate, the etch stop layer on the substrate, and a layer of second hard mask material on the etch stop layer, the hole precursor extending through the layer of second hard mask material to expose a portion of the etch stop layer within the hole precursor; and forming the blind hole by selectively removing at least a portion of the etch stop layer exposed within the hole precursor and a portion of the substrate underlying the hole precursor.

4. The method of claim 3, wherein forming the hole precursor comprises exposing the second workpiece to a first etching chemistry that is configured to selectively remove at least a portion of the layer of second hard mask material to expose the portion of the etch stop layer.

5. The method of claim 4, wherein:
the second hardmask material comprises amorphous silicon;
the etch stop layer comprises an oxide; and
the first etching chemistry is configured to selectively etch amorphous silicon without or without substantially etching the oxide of the etch stop layer.

6. The method of claim 4, wherein exposing the second workpiece to the first etching chemistry comprises exposing the workpiece to a mixture of hydrogen bromide and oxygen.

7. The method of claim 5, wherein forming the blind hole comprises exposing the second workpiece to a second etching chemistry that is different from the first etching chemistry, the second etching chemistry configured to selectively remove at least a portion of the etch stop layer exposed within the hole precursor and a portion of the substrate underlying the hole precursor.

8. The method of claim 7, wherein the second hardmask material is unaffected or substantially unaffected by the second etching chemistry.

9. The method of claim 8, wherein:
the second hardmask material comprises amorphous silicon;
the etch stop layer comprises an oxide; and
the second etching chemistry is configured to selectively etch the oxide of the etch stop layer without or without substantially etching amorphous silicon.

10. The method of claim 9, wherein exposing the second workpiece to the second etching chemistry comprises exposing the second workpiece to one or more carbon and fluorine containing etchants of the formula $C_xF_y$, wherein x is an integer ranging from 3 to 5 and y is an integer ranging from 6 to 8.

11. The method of claim 1, wherein the blind hole and the structure extending from the surface of the substrate have a width ranging from greater than 0 to less than or equal to about 50 nanometers (nm).

12. The method of claim 1, wherein the layer of first hardmask material comprises one or more of an oxide, carbide, or nitride.

13. The method of claim 3, wherein the layer of second hardmask material is formed from amorphous silicon and the layer of first hardmask material is formed from an oxide, a carbide, or a nitride.

14. The method of claim 13, wherein the layer of first hardmask material is formed from silicon carbide.

* * * * *